(12) United States Patent
Min

(10) Patent No.: US 11,727,253 B2
(45) Date of Patent: Aug. 15, 2023

(54) NEURAL NETWORK SYSTEM INCLUDING GATE CIRCUIT FOR CONTROLLING MEMRISTOR ARRAY CIRCUIT

(71) Applicant: KOOKMIN UNIVERSITY INDUSTRY ACADEMY COOPERATION FOUNDATION, Seoul (KR)

(72) Inventor: Kyeong Sik Min, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 688 days.

(21) Appl. No.: 16/682,420

(22) Filed: Nov. 13, 2019

(65) Prior Publication Data

US 2020/0302277 A1 Sep. 24, 2020

(30) Foreign Application Priority Data

Mar. 22, 2019 (KR) .................. 10-2019-0032866

(51) Int. Cl.
*G06N 3/00* (2023.01)
*G06N 3/063* (2023.01)
*G11C 13/00* (2006.01)
*G06N 3/04* (2023.01)

(52) U.S. Cl.
CPC .............. *G06N 3/063* (2013.01); *G06N 3/04* (2013.01); *G11C 13/003* (2013.01); *G11C 13/0069* (2013.01); *G11C 2213/79* (2013.01)

(58) Field of Classification Search
CPC .... G11C 11/54; G11C 13/003; G11C 13/0069
See application file for complete search history.

(56) References Cited

U.S. PATENT DOCUMENTS

| 10,115,894 | B2 | 10/2018 | Kim et al. |
| 10,249,350 | B2 | 4/2019 | Manning et al. |
| 10,452,972 | B2 | 10/2019 | Degraeve et al. |
| 2014/0122402 | A1* | 5/2014 | Bichler .................. G06N 3/063 706/27 |
| 2017/0011290 | A1* | 1/2017 | Taha ..................... G06N 3/0635 |
| 2018/0181867 | A1 | 6/2018 | Seibold et al. |
| 2018/0276539 | A1 | 9/2018 | Lea |
| 2018/0300619 | A1 | 10/2018 | Lee |

(Continued)

FOREIGN PATENT DOCUMENTS

| JP | 6293963 B1 | 3/2018 |
| KR | 10-2017-0024605 A | 3/2017 |

(Continued)

*Primary Examiner* — Uyen Smet
(74) *Attorney, Agent, or Firm* — Harness, Dickey & Pierce, P.Lc.

(57) ABSTRACT

A neural network system includes an array circuit and a gate circuit. The array circuit generates output data based on first input data, by a plurality of memory cells. The gate circuit outputs a select signal, based on defect information which is obtained based on the output data. A target memory cell, which is activated in response to the select signal, from among the plurality of memory cells is trained based on second input data, and the defect information is associated with a defect included in the plurality of memory cells.

20 Claims, 14 Drawing Sheets

(56) References Cited

U.S. PATENT DOCUMENTS

2019/0228287 A1* 7/2019 Okazaki ................ G06N 3/049
2020/0272891 A1   8/2020 Terasaki

FOREIGN PATENT DOCUMENTS

| KR | 10-2018-0009315 A | 1/2018 |
| KR | 10-2018-0072562 A | 6/2018 |
| KR | 10-2018-0116637 A | 10/2018 |
| KR | 10-2019-0020056 A | 2/2019 |
| KR | 10-2019-0121859 A | 10/2019 |

* cited by examiner

NEURAL NETWORK SYSTEM INCLUDING GATE CIRCUIT FOR CONTROLLING MEMRISTOR ARRAY CIRCUIT

CROSS-REFERENCE TO RELATED APPLICATIONS

This application claims priority under 35 U.S.C. § 119 to Korean Patent Application No. 10-2019-0032866 filed on Mar. 22, 2019, in the Korean Intellectual Property Office, the disclosures of which are incorporated by reference herein in their entireties.

BACKGROUND

Embodiments of the inventive concept disclosed herein relate to a neural network system, and more particularly, relate to a neural network system including a memristor array circuit.

A neural network refers to an algorithm for modeling the human brain and an electronic circuit/device/system for implementing the algorithm. The neural network includes a large number of neurons as a basic unit, and the neurons transfer signals to other neurons through synapses.

The neural network is used to perform machine learning. The neural network may perform learning based on input training data. For example, the neural network may learn a feature and a pattern of the input training data. The neural network may generate an answer to a newly input question based on the learning.

The training of the neural network may be classified into pre-training and re-training. The pre-training is performed on all the neurons of the neural network under the same conditions, but the re-training is individually performed on neurons based on features of the respective neurons. Accordingly, costs necessary to perform the re-training increase. For this reason, there is required a technology for reducing costs of the re-training.

SUMMARY

Embodiments of the inventive concept provide a neural network system including a gate circuit for selectively activating memory cells included in a memristor array circuit.

According to an example embodiment, a neural network system may include an array circuit. The array circuit may generate output data based on first input data, by a plurality of memory cells. The gate circuit may output a select signal, based on defect information which is obtained based on the output data. A target memory cell, which is activated in response to the select signal, from among the plurality of memory cells may be trained based on second input data, and the defect information may be associated with a defect included in the plurality of memory cells.

According to an example embodiment, a neural network system may include a gate circuit and an array circuit. Based on defect information, the gate circuit may output a select signal of a first logical value for activating a target column or may output the select signal of a second logical value for deactivating the target column. The array circuit may generate output data corresponding to input data, by the target column which is programmed by the input data in response to the select signal of the first logical value. The defect information may be associated with an error included in the output data.

According to an example embodiment, a neural network system may include a gate circuit and an array circuit. Based on defect information, the gate circuit may output a select signal to a first column during a first time period and may output the select signal to a second column during a second time period after the first time period. The array circuit may include the first column and the second column, each of which generates an output voltage in response to the select signal of the first logical value and is deactivated in response to the select signal of the second logical value. The defect information may be associated with the output data.

BRIEF DESCRIPTION OF THE FIGURES

The above and other objects and features of the inventive concept will become apparent by describing in detail example embodiments thereof with reference to the accompanying drawings.

DETAILED DESCRIPTION

Hereinafter, embodiments of the inventive concept are described in detail with reference to the accompanying drawings. In the following description, specific details such as detailed components and structures are merely provided to assist the overall understanding of the embodiments of the inventive concept. Therefore, it should be apparent to those skilled in the art that various changes and modifications of the embodiments described herein may be made without departing from the scope and spirit of the present invention. In addition, descriptions of well-known functions and structures are omitted for clarity and conciseness. The terms described below are terms defined in consideration of the functions in the inventive concept and are not limited to a specific function. The definitions of the terms should be determined based on the contents throughout the specification.

In the following drawings or in the detailed description, circuits may be connected with any other components in addition to components illustrated in drawings or disclosed in the detailed description. Connections between circuits or components may be direct or indirect. Circuits or components may be connected through respective communication or may be physically connected.

Unless defined differently, all terms used herein, which include technical terminologies or scientific terminologies, have the same meaning as that understood by a person skilled in the art to which the present invention belongs. Terms defined in a generally used dictionary are to be interpreted to have meanings equal to the contextual meanings in a relevant technical field, and are not interpreted to have ideal or excessively formal meanings unless clearly defined in the specification.

Figure 1:
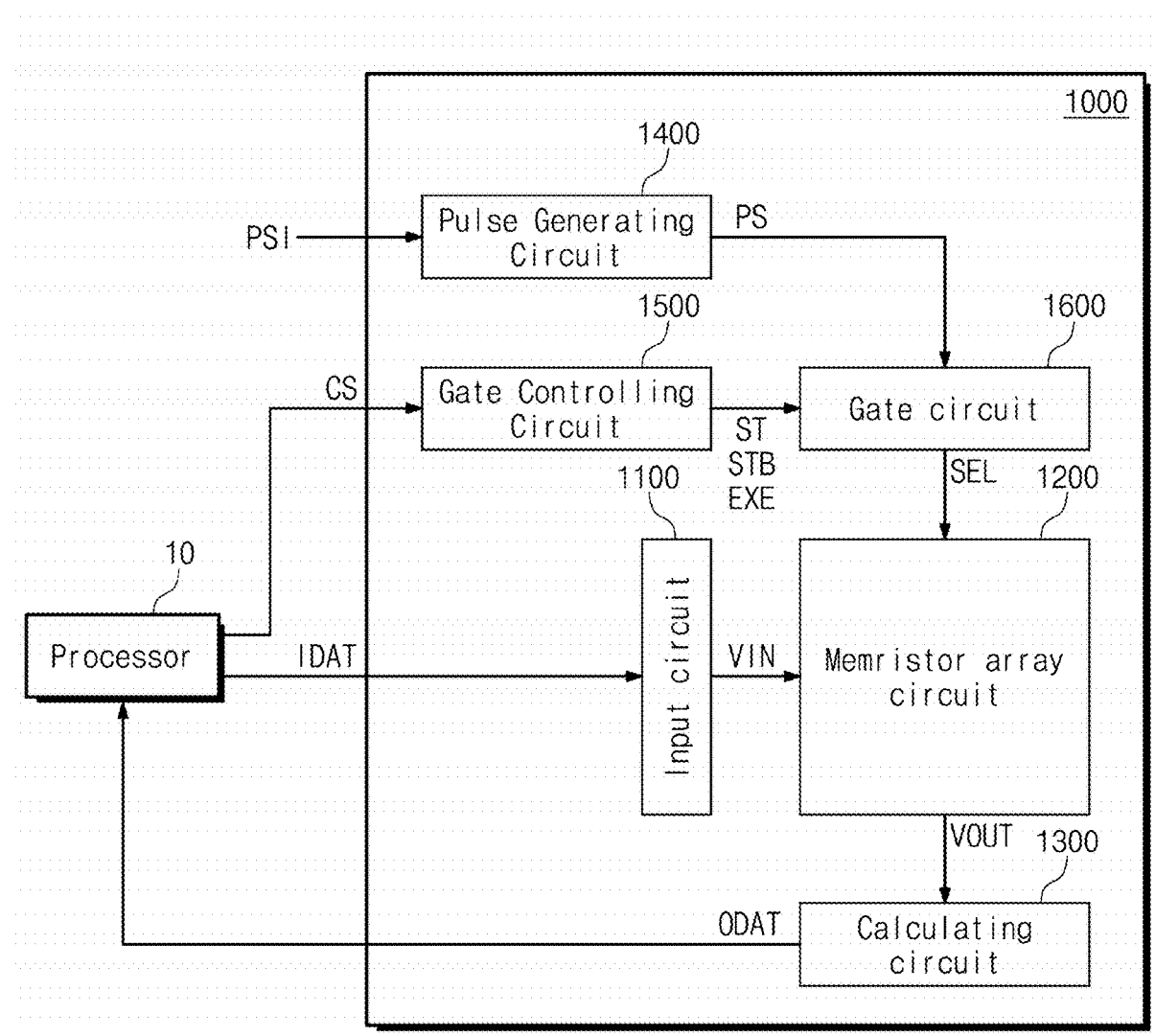
FIG. 1 is a block diagram illustrating a neural network system according to an embodiment of the inventive concept.

FIG. 1 is a block diagram illustrating a neural network system according to an embodiment of the inventive concept.

Referring to FIG. 1, a neural network system 1000 may include an input circuit 1100, a memristor array circuit 1200, a calculating circuit 1300, a pulse generating circuit 1400, a gate controlling circuit 1500, and a gate circuit 1600. For example, the neural network system 1000 may be a component of an electronic device (refer to FIG. 14). For example, the electronic device including the neural network system 1000 may be one of a personal computer (PC), a workstation, a notebook computer, a mobile device, etc.

The input circuit 1100 may generate a voltage VIN. An example is illustrated in FIG. 1 as the voltage VIN is a single voltage. However, as will be described with reference to FIG. 10, the input circuit 1100 may generate one or more voltages, and the voltage VIN may include the one or more voltages generated by the input circuit 1100. For example, the one or more voltages may be respectively output to rows including memory cells of the memristor array circuit 1200.

For example, the electronic device including the neural network system 1000 may include a processor 10. The processor 10 may generate data for learning and training of the neural network system 1000 based on various logic circuits. For example, the processor 10 may generate data for pre-training of the neural network system 1000. Alternatively, the processor 10 may generate data for re-training of the neural network system 1000.

In the specification, the expression "training" means programming a weight in the memristor array circuit 1200. The training of the memristor array circuit 1200 may include the pre-training and the re-training.

The pre-training means programming a weight in the memristor array circuit 1200 for the first time. For example, the processor 10 may generate data for the purpose of the pre-training for an ideal state (i.e., a state where memory cells do not include a defect) of the memory cells constituting the memristor array circuit 1200.

The re-training means reprogramming the memristor array circuit 1200 for the purpose of decreasing an error of data output from the memristor array circuit 1200. For example, the processor 10 may obtain information about defects included in the memory cells of the memristor array circuit 1200 (e.g., mapping information about defects of the memory cells) and may generate data for the purpose of performing the re-training on memory cells that are determined as including a defect. By performing the re-training in which defects of memory cells are considered, data that the memristor array circuit 1200 will output may include an error of a smaller magnitude.

The processor 10 may output a signal IDAT indicating data generated for the pre-training and/or the re-training, to the input circuit 1100. The input circuit 1100 may generate the voltage VIN indicating data for the pre-training and/or the re-training in response to the signal IDAT. The input circuit 1100 may output the voltage VIN to the memristor array circuit 1200 in the unit of row.

Alternatively, the processor 10 may output the signal IDAT indicating input data to the input circuit 1100 for the purpose of obtaining result data from the learned and trained memristor array circuit 1200. For example, the input data may refer to data that are input by a user for the purpose of solving a particular question or the like. For example, the result data may refer to data that are output by the neural network system 1000 in response to the input data. The input circuit 1100 may generate the voltage VIN indicating the input data based on the signal IDAT output from the processor 10. The input circuit 1100 may output the voltage VIN indicating the input data to the memristor array circuit 1200 in the unit of row.

The memristor array circuit 1200 may include a plurality of memory cells. For example, each of the plurality of memory cells may be implemented with a memristor component. For example, the memristor array circuit 1200 may include a memory cell array formed with a memristor crossbar structure. The memristor array circuit 1200 may receive the voltage VIN from the input circuit 1100. The memory cells of the memristor array circuit 1200 may have characteristic values that vary with the voltage VIN. For example, each of the memory cells may include a memristor component, and device values of the memristor components may vary with the voltage VIN that is supplied in the unit of row. Each memory cell may store data based on a varying characteristic value.

Below, a memristor resistance having a resistance value as a characteristic value will be described as an embodiment of the memristor component, but the inventive concept is not limited thereto. For example, it may be understood that the memristor component of the inventive concept may be implemented with various kinds of memory devices having a characteristic value that varies with supplied voltage and current.

The memristor array circuit 1200 may receive a signal SEL from the gate circuit 1600. As will be described with reference to the gate circuit 1600, the signal SEL may include one or more signals. For example, the signal SEL may include signals respectively corresponding to columns of the memristor array circuit 1200. The memristor array circuit 1200 may operate in the unit of column based on the signal SEL.

The memristor array circuit 1200 may output a voltage VOUT based on the voltage VIN. For example, the voltage VIN may indicate the input data generated by the processor 10. Learned and trained memory cells of the memristor array circuit 1200 may generate the voltage VOUT indicating output data, based on the voltage VIN. The memristor array circuit 1200 may output the voltage VOUT to the calculating circuit 1300.

An example is illustrated in FIG. 1 as the voltage VOUT is one voltage, but the voltage VOUT may include one or more voltages indicating the output data. For example, the memristor array circuit 1200 may output voltages, which are generated by columns selected by the signal SEL, as the voltage VOUT. That is, one or more voltages indicated as the voltage VOUT in FIG. 1 may respectively correspond to one or more columns including the memory cells of the memristor array circuit 1200.

The memory cells of the memristor array circuit 1200 may have defects coming from various causes. For example, the memory cells may have a defects coming from a process error. Due to memory cells having defects, the memristor array circuit 1200 may generate the output data including an error based on the voltage VIN. Accordingly, it is necessary to perform the re-training on memory cells having defects.

The calculating circuit 1300 may receive the voltage VOUT indicating the output data from the memristor array circuit 1200. The calculating circuit 1300 may obtain result data by calculating the output data based on an activation function. The calculating circuit 1300 may generate a signal ODAT for transferring the result data.

The calculating circuit 1300 may include electronic circuits configured to perform a calculation on the output data based on the activation function. For example, the calculating circuit 1300 may include electronic circuits configured to implement calculations of various types of activation functions such as a sigmoid function and a rectified linear unit (ReLU) function, but embodiments of the inventive concept are not limited thereto. An example configuration and example operations of the calculating circuit 1300 will be more fully described with reference to FIG. 13.

The pulse generating circuit 1400 may receive a signal PSI including a pulse from the outside of the neural network system 1000. For example, the pulse generating circuit 1400 may receive the signal PSI from a function generator provided outside the neural network system 1000. The pulse generating circuit 1400 may generate a signal PS including at least one pulse based on the signal PSI.

An example is illustrated in FIG. 1 as the signal PS is one signal, but the pulse generating circuit 1400 may generate the signal PS including signals respectively corresponding to the columns of the memristor array circuit 1200. The pulse generating circuit 1400 may output the signal PS to the gate circuit 1600. An example configuration and example operations of the pulse generating circuit 1400 will be more fully described with reference to FIG. 3.

The gate controlling circuit 1500 may receive a signal CS from the processor 10. The gate controlling circuit 1500 may generate signals ST, STB, and EXE for controlling the gate circuit 1600 based on the signal CS. The gate controlling circuit 1500 may output the signals ST, STB, and EXE to the gate circuit 1600. For example, the signals ST and STB may have complementary logical values. Also, the gate controlling circuit 1500 may adjust a level of an operation voltage that is supplied to the gate circuit 1600.

For example, the processor 10 may select columns targeted for the re-training from among the columns included in the memristor array circuit 1200, based on the signal ODAT received from the calculating circuit 1300. For example, the processor 10 may obtain result data based on the signal ODAT. The processor 10 may obtain defect information about respective memory cells of the memristor array circuit 1200, based on the obtained result data. The processor 10 may perform various logic-based calculations for the purpose of obtaining the defect information based on the result data.

In the specification, the defect information refers to information indicating whether any memory cells of the memory cells included in the memristor array circuit 1200 include defects. For example, the defect information may include information indicating memory cells, in which the degree of contribution to an error of the result data is a reference value or greater, from among the memory cells of the memristor array circuit 1200.

The processor 10 may select columns targeted for the re-training from among the columns of the memristor array circuit 1200, based on the obtained defect information. The processor 10 may output the signal CS for the purpose of controlling the memristor array circuit 1200 such that the re-training is performed only on the selected columns and may adjust a level of the operation voltage provided to the gate circuit 1600. For example, the processor 10 may output the signal CS including the defect information to the gate controlling circuit 1500.

The gate controlling circuit 1500 may adjust a level of the operation voltage to be supplied to the gate circuit 1600 for the purpose of programming the gate circuit 1600 based on the obtained defect information. Example operations of the gate controlling circuit 1500 for controlling the gate circuit 1600 based on the signals ST, STB, and EXE will be more fully described with reference to FIGS. 4 to 9.

The gate circuit 1600 may receive the signals ST, STB, and EXE from the gate controlling circuit 1500. The gate circuit 1600 may output the signal SEL having a particular logical value to the memristor array circuit 1200 based on the signals ST, STB, and EXE. The signals ST and STB may be associated with whether a particular column of the memristor array circuit 1200 is targeted for the re-training. The signal EXE may be associated with whether to activate all the columns of the memristor array circuit 1200.

For example, based on the signals ST and STB, the gate circuit 1600 may output the signal SEL having a logical value of "1" to columns of the memristor array circuit 1200 targeted for the re-training and may output the signal SEL having a logical value of "0" to columns of the memristor array circuit 1200 not targeted for the re-training. For example, based on the signal EXE, the gate circuit 1600 may output the signal SEL having a logical value of "1" for the purpose of performing the pre-training or for the purpose of performing an inference operation on any input data input by the user.

Figure 2:
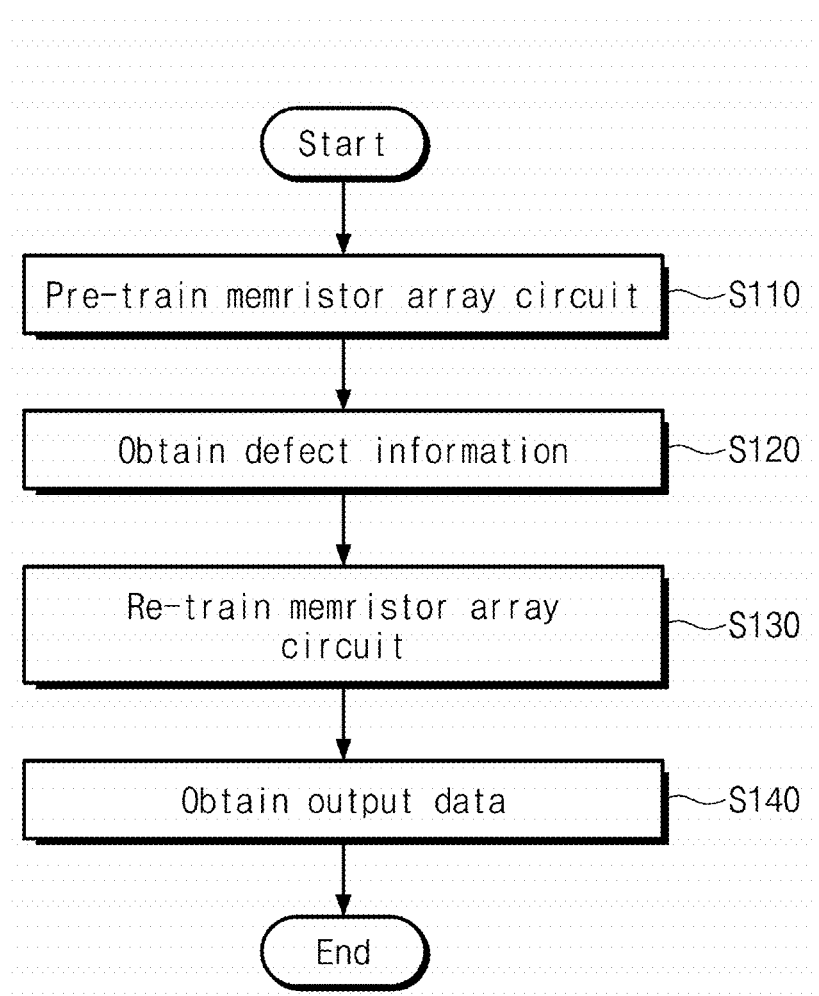
FIG. 2 is a flowchart illustrating example operations of a processor and a neural network system of FIG. 1.

FIG. 2 is a flowchart illustrating example operations of a processor and a neural network system of FIG. 1.

In operation S110, the pre-training may be performed on the memristor array circuit 1200. For example, the processor 10 may generate input data for the pre-training of the memristor array circuit 1200. The input data for the pre-training may be generated without consideration of defects included in memory cells of the memristor array circuit 1200.

The processor 10 may output the signal IDAT indicating the input data for the pre-training. The input circuit 1100 may output the voltage VIN based on the signal IDAT. The processor 10 may output the signal CS to control the gate controlling circuit 1500, such that the pre-training is performed on all the columns of the memristor array circuit 1200. The gate controlling circuit 1500 may output the signal EXE based on the signal CS. The gate circuit 1600 may output the signal SEL having a logical value that is determined based on the signal EXE.

The processor 10 may output the signal IDAT indicating the input data for the pre-training to the input circuit 1100. The input circuit 1100 may output the voltage VIN based on the signal IDAT. The pre-training may be performed such that characteristic values of the memory cells included in the memristor array circuit 1200 are changed based on the voltage VIN.

In operation S120, defect information about the memory cells of the memristor array circuit 1200 may be obtained. For example, the calculating circuit 1300 may generate the signal ODAT based on the voltage VOUT output from the memristor array circuit 1200 having the characteristic values changed by the pre-training. The processor 10 may calculate an error included in output data of the voltage VOUT based on result data of the signal ODAT. The processor 10 may calculate the degree of contribution to the error included in the output data in the unit of memory cells and/or in the unit of column.

In the specification, the error may be associated with a difference between result data intended by the user and result data actually obtained based on the signal ODAT. Here, it may be well understood that the expression "difference" means a conceptual difference rather than an arithmetic difference. For example, the user may input an answer (i.e., the result data intended by the user) to a predefined question (i.e., input data) to the processor 10. The processor 10 may compare the output data intended by the user and the result data received from the calculating circuit 1300 to calculate an error. For example, the processor 10 may calculate an error through logic circuits implementing various types of error functions.

For example, the processor 10 may obtain the result data in the unit of column of the memristor array circuit 1200. The processor 10 may calculate errors respectively corresponding to the columns. The processor 10 may calculate the degrees of contribution of result data, which correspond to each column of the memristor array circuit 1200, to an error based on various algorithms. The processor 10 may obtain defect information indicating columns (hereinafter referred to as "target columns"), each of which generates output data corresponding to result data in which the degree of contribution to an error is a reference value or greater.

In operation S130, the re-training may be performed on the memristor array circuit 1200. The processor 10 may output the signal IDAT indicating input data for the re-training. The input circuit 1100 may output the voltage VIN based on the signal IDAT. The processor 10 may output the signal CS to control the gate controlling circuit 1500, such that the re-training is performed only on target columns based on the defect information obtained in operation S120.

The gate controlling circuit 1500 may output the signals ST and STB based on the signal CS. The gate circuit 1600 may output the signal SEL having a logical value that is determined based on the signals ST and STB. An example configuration of the gate circuit 1600 will be more fully described with reference to FIG. 5. Example operations of the gate controlling circuit 1500 and the gate circuit 1600 will be more fully described with reference to FIGS. 7 to 9.

The columns of the memristor array circuit 1200 may be selectively activated in response to the signal SEL. Target columns of the columns of the memristor array circuit 1200 may be activated in response to the signal SEL. The activated target columns may be re-trained based on the voltage VIN. An example is illustrated in FIG. 2 as operation S130 is performed once, but it may be well understood that operation S130 is repeatedly performed. For example, operation S130 may be repeatedly performed until an error included in result data decreases to a threshold value or less.

In operation S140, the neural network system 1000 may be used to obtain output data associated with any input data. For example, the user may input, to the processor 10, input data corresponding to a particular question for the purpose of obtaining an answer to the particular question. The processor 10 may output the signal IDAT indicating the input data. The processor 10 may output the signal CS and may control the gate controlling circuit 1500 such that all the columns of the memristor array circuit 1200 are activated.

The gate controlling circuit 1500 may output the signal EXE based on the signal CS. The gate circuit 1600 may output the signal SEL having a logical value that is determined based on the signal EXE. All the columns of the memristor array circuit 1200 may be activated in response to the signal SEL. The memristor array circuit 1200 may output the voltage VOUT indicating the output data corresponding to the input data. The calculating circuit 1300 may provide the result data to the processor 10 based on the output data. The processor 10 may provide the user with a variety of information about an answer to a particular question, based on the result data.

Figure 3:
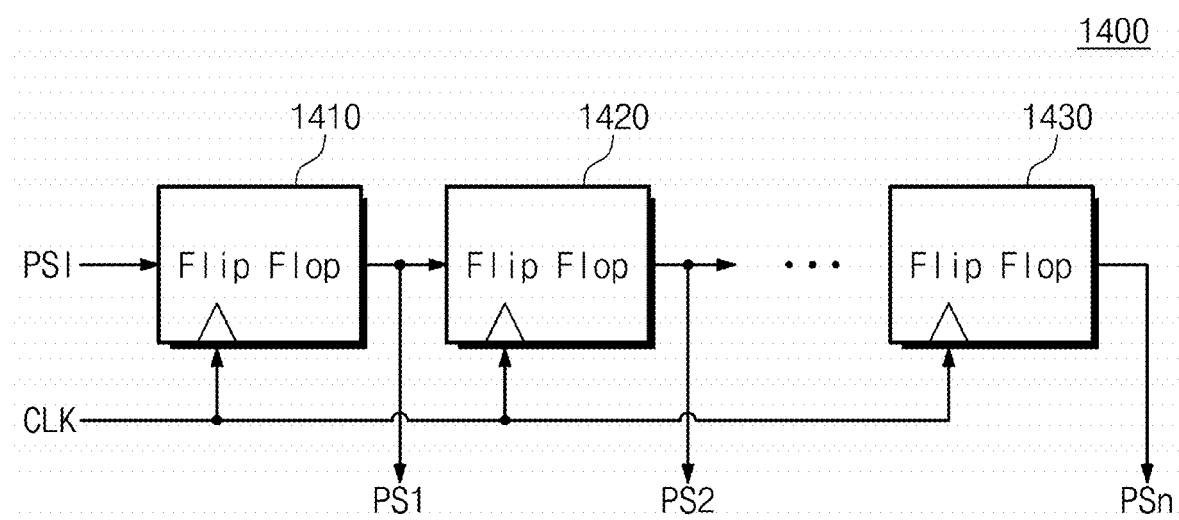
FIG. 3 is a block diagram illustrating an example configuration of a pulse generating circuit of FIG. 1.

FIG. 3 is a block diagram illustrating an example configuration of a pulse generating circuit of FIG. 1.

Referring to FIG. 3, the pulse generating circuit 1400 may include flip-flops 1410 to 1430. The pulse generating circuit 1400 may receive the signal PSI including a pulse from a signal generator provided outside the neural network system 1000. The pulse generating circuit 1400 may receive a clock CLK from an electronic device such as a clock generator provided outside the neural network system 1000.

The flip-flops 1410 to 1430 may output signals PS1 to PSn (n being a natural number) to the memristor array circuit 1200 based on the clock CLK and the signal PSI. For example, the flip-flops 1410 to 1430 may output the signals PS1 to PSn to the columns of the memristor array circuit 1200, respectively. For example, the pulse generating circuit 1400 may include "n" flip-flops 1410 to 1430 corresponding to the number of columns included in the memristor array circuit 1200 for the purpose of generating the signals PS1 to PSn respectively corresponding to the columns of the memristor array circuit 1200.

The flip-flop 1410 may store a pulse of the signal PSI during one period of the clock CLK. The flip-flop 1410 may output the signal PS1 including the pulse to the flip-flop 1420 and the memristor array circuit 1200 in response to the signal PSI and the clock CLK. For example, the flip-flop 1410 may output the signal PS1 to a first column of the memristor array circuit 1200.

As in the flip-flop 1410, the flip-flop 1420 may generate the signal PS2 based on the signal PS1 received from the flip-flop 1410 and the clock CLK. The flip-flop 1420 may output the signal PS2 to the memristor array circuit 1200 and a different flip-flop connected with an output of the flip-flop 1420. For example, the flip-flop 1420 may output the signal PS2 to a second column of the memristor array circuit 1200. As in the flip-flop 1410, the flip-flop 1430 may output the signal PSn including the pulse to an n-th column of the memristor array circuit 1200.

According to the above operations, the pulse generating circuit 1400 may sequentially output the signals PS1 to PSn over time. For example, the pulse generating circuit 1400 may output the signal PS1 and may then output the signal PS2. The pulse generating circuit 1400 may output the signal PSn after signals are output from flip-flops in front of the flip-flop 1430.

Figure 4:
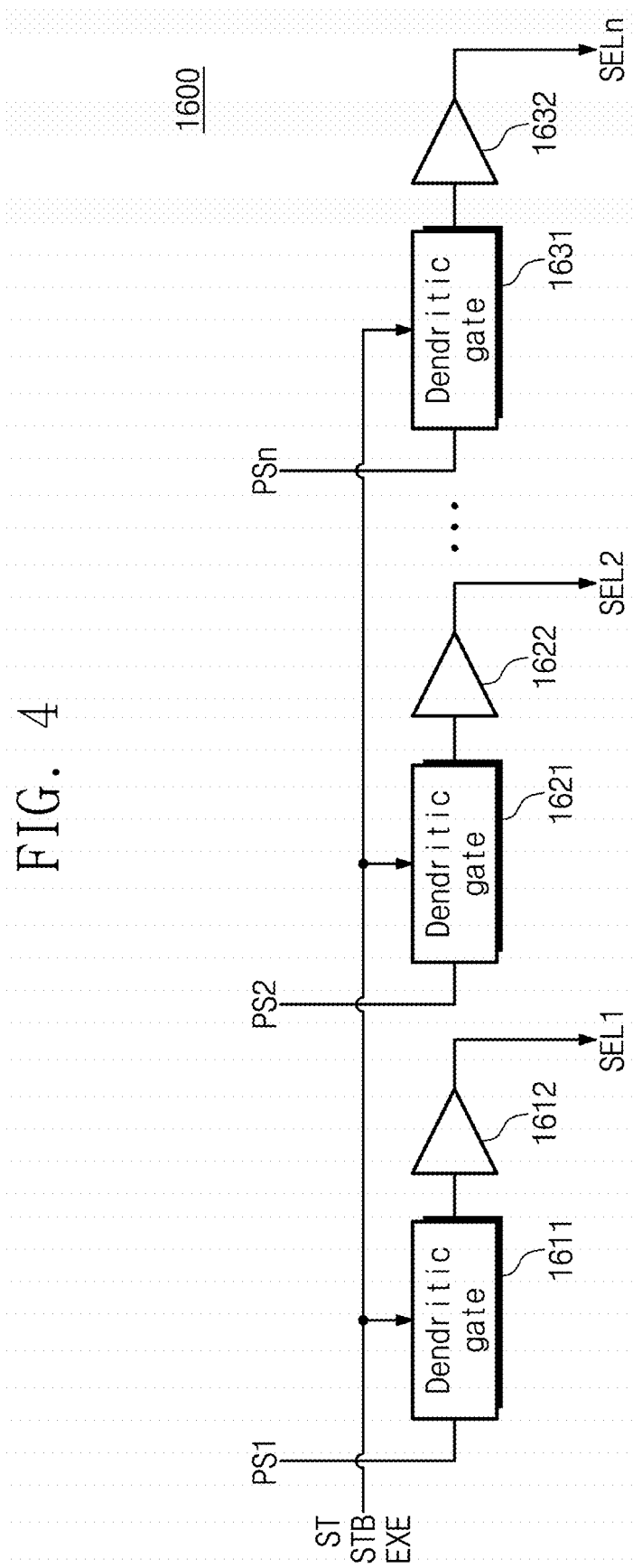
FIG. 4 is a block diagram illustrating an example configuration of a gate circuit of FIG. 1.

FIG. 4 is a block diagram illustrating an example configuration of a gate circuit of FIG. 1.

Referring to FIG. 4, the gate circuit 1600 may include dendritic gates 1611 to 1631 and buffers 1612 to 1632. The dendritic gates 1611 to 1631 may receive the signals ST, STB, and EXE from the gate controlling circuit 1500. The dendritic gates 1611 to 1631 may receive the signals PS1 to PSn from the pulse generating circuit 1400.

The dendritic gates 1611 to 1631 may be controlled by the signals ST, STB, and EXE and may output signals SEL1 to SELn based on the signals PS1 to PSn, respectively. The signals PS1 to PSn may be associated with columns of the memristor array circuit 1200, which are selected as a target of the re-training. The dendritic gates 1611 to 1631 may sequentially output the signals SEL1 to SELn in response to the signals PS1 to PSn sequentially output from the pulse generating circuit 1400.

Afterwards, the columns of the memristor array circuit 1200 may sequentially operate in response to the signals SEL1 to SELn that are sequentially output from the gate circuit 1600. An example configuration and example operations of the dendritic gates 1611 to 1631 will be more fully described with reference to FIG. 5.

The buffers 1612 to 1632 may pass the signals SEL1 to SELn output from the dendritic gates 1611 to 1631 to the memristor array circuit 1200. The buffers 1612 to 1632 may stably transfer the signals SEL1 to SELn to the memristor array circuit 1200 from the dendritic gates 1611 to 1631. For example, the buffers 1612 to 1632 may block a noise coming from the dendritic gates 1611 to 1631 so as not to be transferred to the memristor array circuit 1200.

The number of the dendritic gates 1611 to 1631 may correspond to the number of the columns of the memristor array circuit 1200. For example, in the case where the memristor array circuit 1200 includes "2n" columns, groups each including two adjacent columns may receive the "n" signals PS1 to PSn, respectively (refer to FIG. 10).

Figure 5:
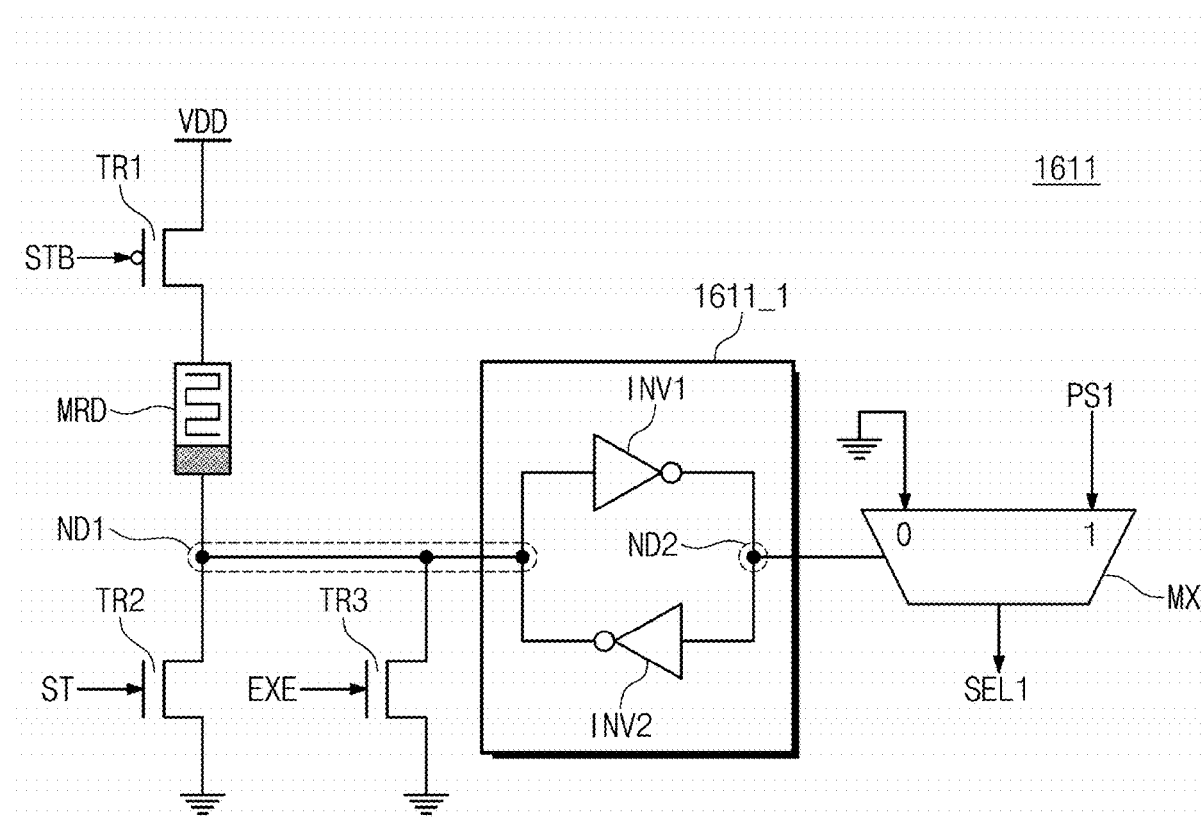
FIG. 5 is a circuit diagram illustrating an example configuration of a dendritic gate of FIG. 4.

FIG. 5 is a circuit diagram illustrating an example configuration of a dendritic gate of FIG. 4.

Referring to FIG. 5, the dendritic gate 1611 may include transistors TR1 to TR3, a memristor component MRD, a latch 1611_1, and a multiplexer MX. The latch 1611_1 may include inverters INV1 and INV2. An example configuration and example operations of the dendritic gates 1621 to 1632 are similar to those of the dendritic gate 1611 to be described below, and thus, additional description will be omitted to avoid redundancy.

The transistor TR1 may receive the signal STB from the gate controlling circuit 1500 through a gate terminal thereof. The transistor TR1 may receive an operation voltage VDD from an electronic device such as a voltage generator provided outside the neural network system 1000. A level of the operation voltage VDD may be adjusted by the gate controlling circuit 1500.

The transistor TR1 may be connected between the memristor component MRD and a supply terminal of the operation voltage VDD. The memristor component MRD may be connected between the transistor TR1 and a node ND1. The transistor TR2 may receive the signal ST through a gate terminal thereof. The transistor TR2 may be connected between the node ND1 and a ground terminal. The transistor TR3 may receive the signal EXE through a gate terminal thereof. The transistor TR3 may be connected between the node ND1 and the ground terminal.

The signals ST and STB may be associated with the re-training for a column of memory cells corresponding to the dendritic gate 1611. For example, to store, in the memristor component MRD, data associated with whether a column corresponding to the dendritic gate 1611 is a target column, the gate controlling circuit 1500 may output the signals ST and STB having logical values for turning on the transistors TR1 and TR2 and may adjust a level of the operation voltage VDD.

In detail, as the transistors TR1 and TR2 are turned on by the signals ST and STB, a current may flow through the memristor component MRD. As the level of the operation voltage VDD is adjusted, a level of a current flowing through the memristor component MRD may change. As the level of the current flowing through the memristor component MRD changes, a resistance value of the memristor component MRD may change.

An example control operation of the gate controlling circuit 1500 that adjusts a level of the operation voltage VDD for the purpose of adjusting a level of a current flowing through the memristor component MRD is described above, but it may be understood that the present disclosure includes various embodiments of operations that are performed to adjust a level of a current flowing through the memristor component MRD.

As a resistance value of the memristor component MRD changes, a logical value of the signal SEL1 that is output to the memristor array circuit 1200 may be determined, which will be described with reference to FIGS. 6 to 8. Depending on a logical value of the signal SEL1, the re-training may be performed on a column corresponding to the dendritic gate 1611. That is, data indicating whether the re-training is performed on the column corresponding to the dendritic gate 1611 (or whether the column corresponding to the dendritic gate 1611 is a target column) may be stored in the memristor component MRD.

Also, to re-train the target column corresponding to the dendritic gate 1611 based on data stored in the memristor component MRD, the signals ST and STB may have logical values for turning on the transistors TR1 and TR2. There may be output the signal SEL1 having a logical value corresponding to a resistance value of the memristor component MRD, which will be described with reference to FIGS. 6 to 8. Afterwards, depending on a logical value of the signal SEL1, the re-training may be performed or may not be performed on the column corresponding to the dendritic gate 1611, which will be described with reference to FIGS. 11 and 12.

An input terminal of the inverter INV1 may be connected with the node ND1, and an output terminal of the inverter INV1 may be connected with a node ND2. An input terminal of the inverter INV2 may be connected with the node ND2, and an output terminal of the inverter INV2 may be connected with the node ND1. An embodiment of the latch 1611_1 including the inverters INV1 and INV2 is described with reference to FIG. 5, but it may be understood that the present disclosure includes electronic circuits for implementing various types of latches configured to store a logical value of a signal received from the node ND1.

The multiplexer MX may be configured to operate based on a signal received from the node ND2. The multiplexer MX may receive a ground voltage from the ground terminal and may receive the signal PS1 from the pulse generating circuit 1400. The multiplexer MX may selectively output, as the signal SEL1, one of a logical value (e.g., a logical value of "0") corresponding to a ground voltage or a logical value (e.g., a logical value of "1") of the signal PS1 in response to the signal received from the node ND2.

For example, the multiplexer MX may output the signal SEL1 having a logical value of "0" corresponding to the ground voltage in response to a logical value of "0" received from the node ND2. Alternatively, the multiplexer MX may output the signal SEL1 having a logical value of "1" corresponding to a pulse included in the signal PS1 in response to a logical value of "1" received from the node ND2. Example operations of the dendritic gate 1611 will be more fully described with reference to FIGS. 6 to 9.

Figure 6:
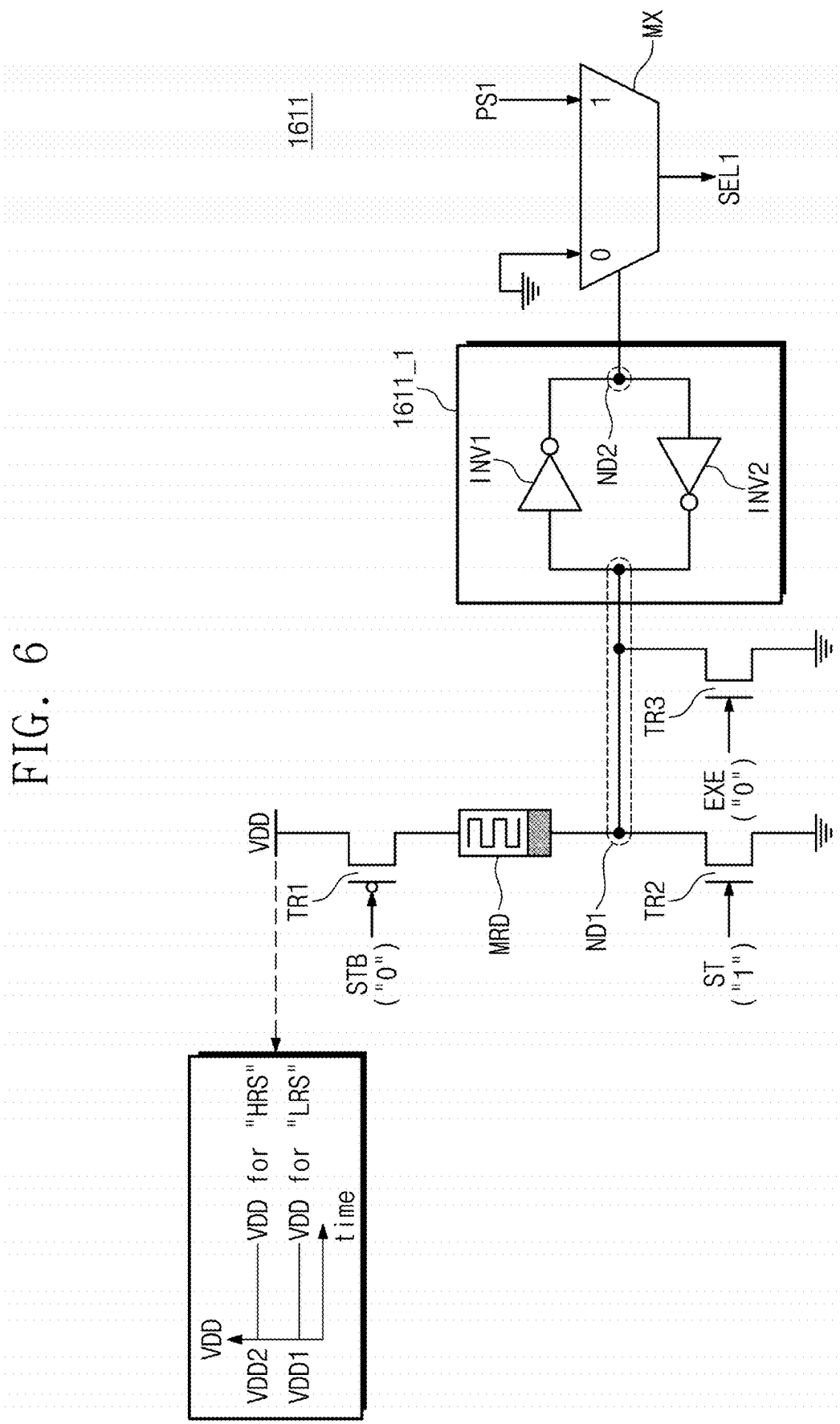
FIGS. 6 to 9 are circuit diagrams illustrating example operations of a dendritic gate of FIG. 4.

FIG. 6 is a circuit diagram illustrating example configurations of a dendritic gate of FIG. 4.

The gate controlling circuit 1500 may output the signal STB having a logical value of "0", the signal ST having a logical value of "1", and the signal EXE having a logical value of "0" in response to the signal CS. The transistor TR1 may be turned on in response to the signal STB having a logical value of "0". A current may flow from the supply terminal of the operation voltage VDD to the memristor component MRD through the transistor TR1.

The current flowing through the transistor TR1 may flow to the node ND1 through the memristor component MRD.

The transistor TR2 may be turned on in response to the signal ST having a logical value of "1". A current may flow from the node ND1 to the ground terminal through the transistor TR2. The transistor TR3 may be turned off in response to the signal EXE having a logical value of "0".

The memristor component MRD may be programmed by the current flowing through the memristor component MRD. As described in operation S120 of FIG. 2, a column corresponding to the dendritic gate 1611 may be selected as a target column by the processor 10. To perform the re-training on the column corresponding to the dendritic gate 1611, the processor 10 may output the signal CS such that the signal SEL1 having a logical value of "1" is output from the dendritic gate 1611 (i.e., so as to activate the target column corresponding to the dendritic gate 1611).

A level of the operation voltage VDD may be adjusted by the gate controlling circuit 1500. For example, the gate controlling circuit 1500 may adjust a level of the operation voltage VDD to "VDD2" such that the memristor component MRD is set to a high resistance state HRS. A current corresponding to the operation voltage VDD having a level of "VDD2" may flow through the transistor TR1 and the memristor component MRD. A device value of the memristor component MRD may be adjusted to a value corresponding to "VDD2". That is, data indicating that the column corresponding to the dendritic gate 1611 is a target column may be programmed by the operation voltage VDD and may be stored in the memristor component MRD.

Alternatively, as described in operation S120 of FIG. 2, the column corresponding to the dendritic gate 1611 may not be selected as a target column by the processor 10. The processor 10 may output the signal CS such that the re-training is not performed on the column corresponding to the dendritic gate 1611. For example, the processor 10 may output the signal CS such that the signal SEL1 having a logical value of "0" is output from the dendritic gate 1611 (i.e., so as to deactivate the target column corresponding to the dendritic gate 1611).

The gate controlling circuit 1500 may adjust a level of the operation voltage VDD to "VDD1" such that the memristor component MRD is set to a low resistance state LRS. For example, "VDD1" may be smaller than "VDD2", but the inventive concept is not limited thereto. For example, a level of the operation voltage VDD may be variously changed to correspond to the LRS of the memristor component MRD.

A current corresponding to the operation voltage VDD having a level of "VDD1" may flow through the transistor TR1 and the memristor component MRD. A device value of the memristor component MRD may be adjusted to a value corresponding to "VDD1". That is, data indicating that the column corresponding to the dendritic gate 1611 is not a target column may be programmed by the operation voltage VDD and may be stored in the memristor component MRD.

An example operation in which the dendritic gate 1611 is programmed by adjusting a level of the operation voltage VDD is described with reference to FIG. 6, but the inventive concept is not limited thereto. The inventive concept may include various embodiments in which a device value of the dendritic gate 1611 is adjusting by adjusting a current flowing to the memristor component MRD.

Figure 7:
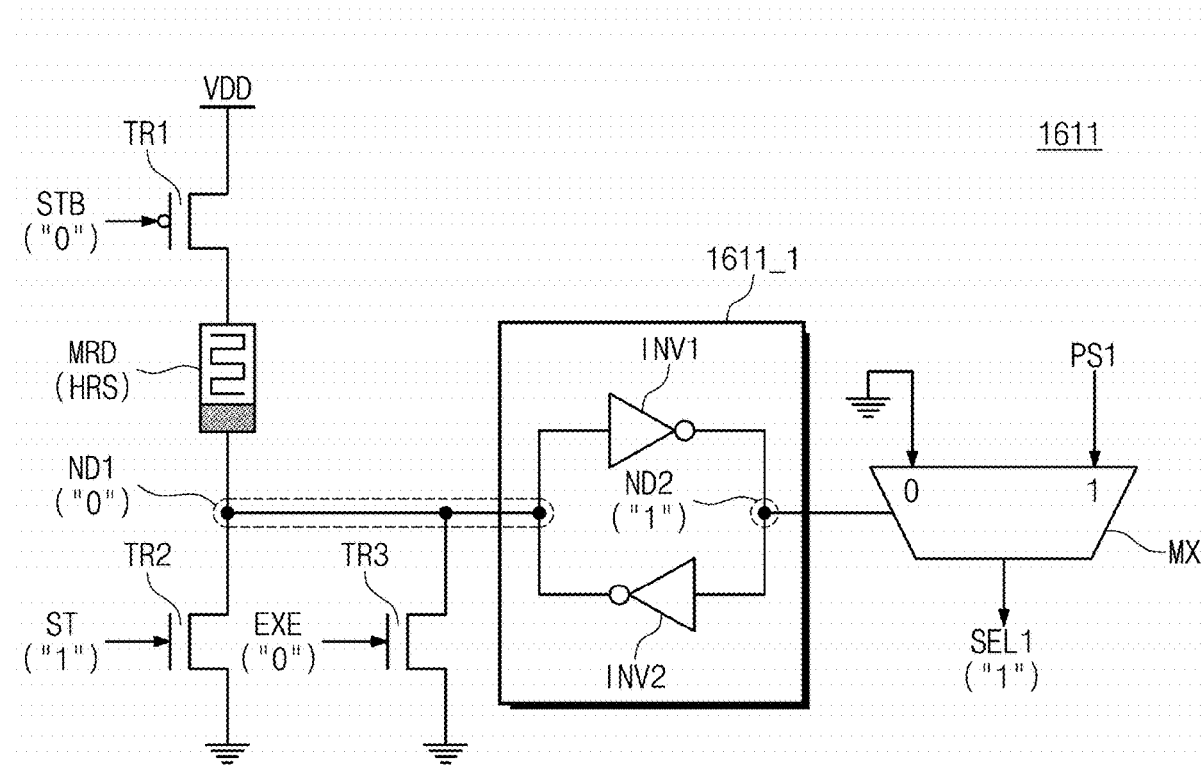

FIG. 7 is a circuit diagram illustrating example configurations of a dendritic gate of FIG. 4.

Below, example operations of the dendritic gate 1611 including the memristor component MRD programmed to the HRS by the operations of FIG. 6 will be described with reference to FIG. 7. After the operations described with reference to FIG. 6 are performed, the gate controlling circuit 1500 may output the signal STB having a logical value of "0", the signal ST having a logical value of "1", and the signal EXE having a logical value of "0" in response to the signal CS. The transistor TR1 may be turned on in response to the signal STB having a logical value of "0". A current may flow from the supply terminal of the operation voltage VDD to the memristor component MRD through the transistor TR1.

The current flowing through the transistor TR1 may flow to the node ND1 through the memristor component MRD. The transistor TR2 may be turned on in response to the signal ST having a logical value of "1". A current may flow from the node ND1 to the ground terminal through the transistor TR2. The transistor TR3 may be turned off in response to the signal EXE having a logical value of "0".

The current flowing through the transistor TR1 may be blocked by the memristor component MRD programmed to the HRS. As a current continuously flows from the node ND1 to the ground terminal through the transistor TR2, a level of a voltage of the node ND1 may decrease. Accordingly, the voltage of the node ND1 may have a low level corresponding to the logical value of "0".

The inverter INV1 may invert a logical value of "0" corresponding to a voltage formed at the node ND1. As the logical value corresponding to the voltage formed at the node ND1 is inverted by the inverter INV1, a logical value of "1" may be stored on the node ND2 by the inverters INV1 and INV2. As the logical value of "1" is stored on the node ND2, the multiplexer MX may output the signal SEL1 having a logical value of the signal PS1. For example, the multiplexer MX may output the signal SEL1 having a logical value of "1" in response to a pulse included in the signal PS1. Memory cells of the column corresponding to the dendritic gate 1611 may be activated for the re-training in response to the signal SEL1 having the logical value of "1", which will be described with reference to FIG. 12.

Figure 8:
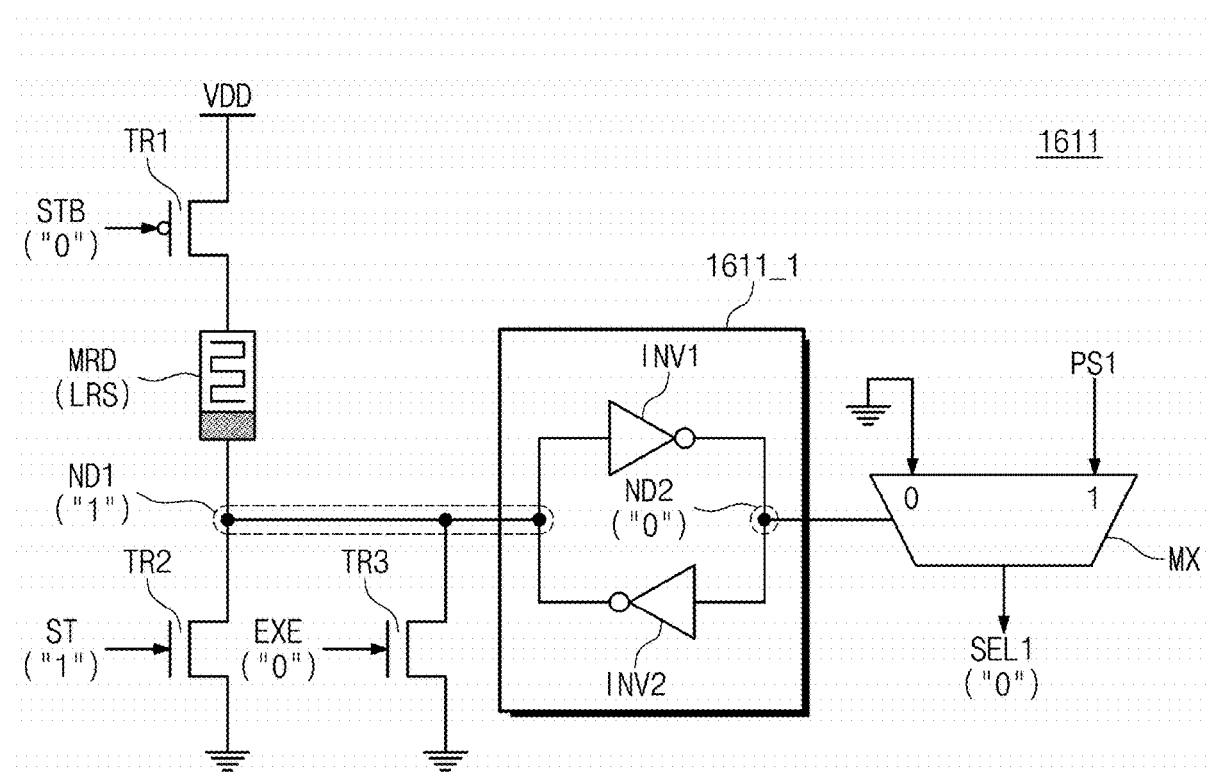

FIG. 8 is a circuit diagram illustrating example configurations of a dendritic gate of FIG. 4.

Below, example operations of the dendritic gate 1611 including the memristor component MRD programmed to the LRS by the operations of FIG. 6 will be described with reference to FIG. 8. After the operations described with reference to FIG. 6 are performed, the gate controlling circuit 1500 may output the signal STB having a logical value of "0", the signal ST having a logical value of "1", and the signal EXE having a logical value of "0" in response to the signal CS. The transistor TR1 may be turned on in response to the signal STB having a logical value of "0". A current may flow from the supply terminal of the operation voltage VDD to the memristor component MRD through the transistor TR1.

The current flowing through the transistor TR1 may flow to the node ND1 through the memristor component MRD programmed to the LRS. The transistor TR2 may be turned on in response to the signal ST having a logical value of "1". A current may flow from the node ND1 to the ground terminal through the transistor TR2. The transistor TR3 may be turned off in response to the signal EXE having a logical value of "0".

A level of a voltage formed at the node ND1 may increase by the current flowing through the transistor TR1 and the memristor component MRD programmed to the LRS. Accordingly, the voltage of the node ND1 may have a high level corresponding to a logical value of "1".

The inverter INV1 may invert a logical value of "1" corresponding to the voltage formed at the node ND1. As the logical value of the voltage formed at the node ND1 is inverted by the inverter INV1, a logical value of "0" may be stored on the node ND2 by the inverters INV1 and INV2. As the logical value of "0" is stored on the node ND2, the multiplexer MX may output the signal SEL1 having a logical value corresponding to the ground voltage. For example, the multiplexer MX may output the signal SEL1 having a logical value of "0". Memory cells of the column corresponding to the dendritic gate 1611 may be deactivated in response to the signal SEL1 having a logical value of "0", which will be described with reference to FIG. 12.

Figure 9:
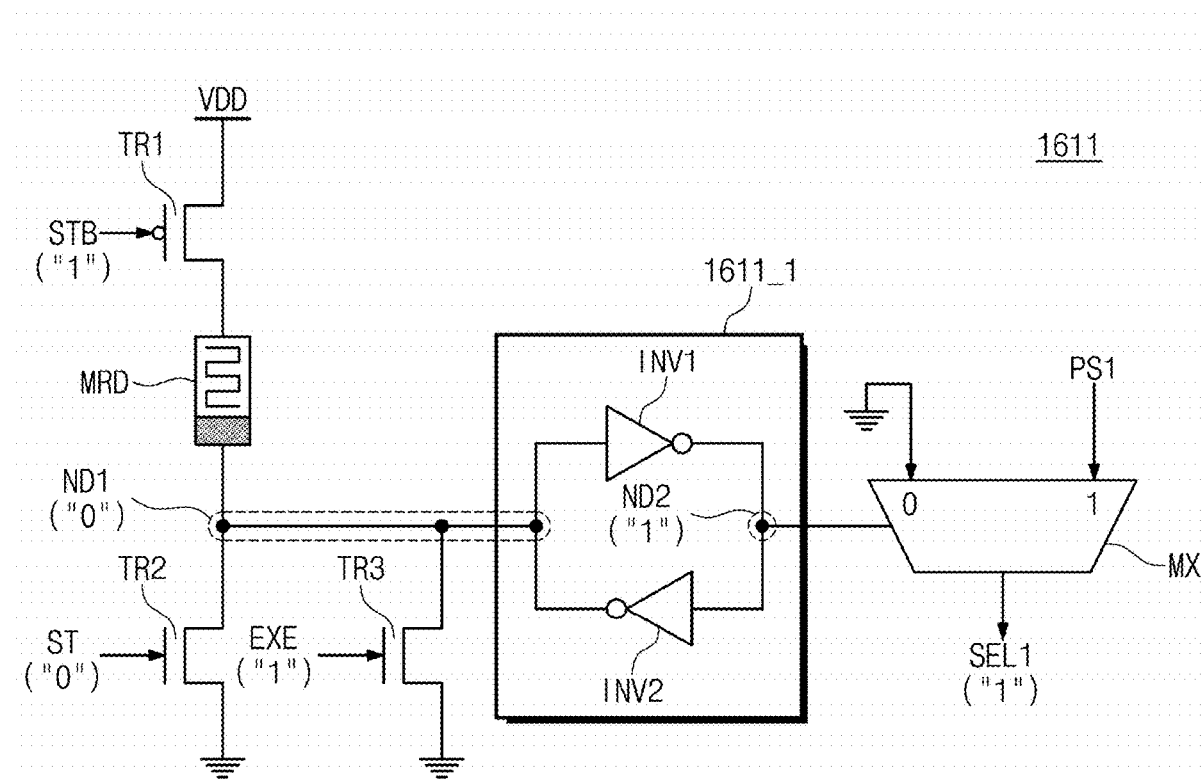

FIG. 9 is a circuit diagram illustrating example operations of a dendritic gate of FIG. 4.

As described in operation S110 of FIG. 2, the processor 10 may output the signal CS such that the pre-training is performed on all the memory cells of the memristor array circuit 1200. Alternatively, in operation S140, the processor 10 may output the signal CS such that all the memory cells are activated to provide information corresponding to input data to the user (i.e., to perform an inference operation).

After the operations described with reference to FIG. 6 are performed, the gate controlling circuit 1500 may output the signal STB having a logical value of "1", the signal ST having a logical value of "0", and the signal EXE having a logical value of "1" in response to the signal CS. The transistor TR1 may be turned off in response to the signal STB having a logical value of "1". The transistor TR2 may be turned off in response to the signal ST having a logical value of "0".

The transistor TR3 may be turned on in response to the signal EXE having a logical value of "1". A current may flow from the node ND1 to the ground terminal through the transistor TR3. As a current flows from the node ND1 to the ground terminal through the transistor TR3, a level of a voltage of the node ND1 may decrease. Accordingly, the voltage of the node ND1 may have a low level corresponding to a logical value of "0" regardless of the operations of the transistors TR1 and TR2.

The inverter INV1 may invert a logical value of "0" corresponding to a voltage formed at the node ND1. As the logical value corresponding to the voltage formed at the node ND1 is inverted by the inverter INV1, a logical value of "1" may be stored on the node ND2 by the inverters INV1 and INV2. As the logical value of "1" is stored on the node ND2, the multiplexer MX may output the signal SEL1 having a logical value of the signal PS1. For example, the multiplexer MX may output the signal SEL1 having a logical value of "1" in response to a pulse included in the signal PS1.

Figure 10:
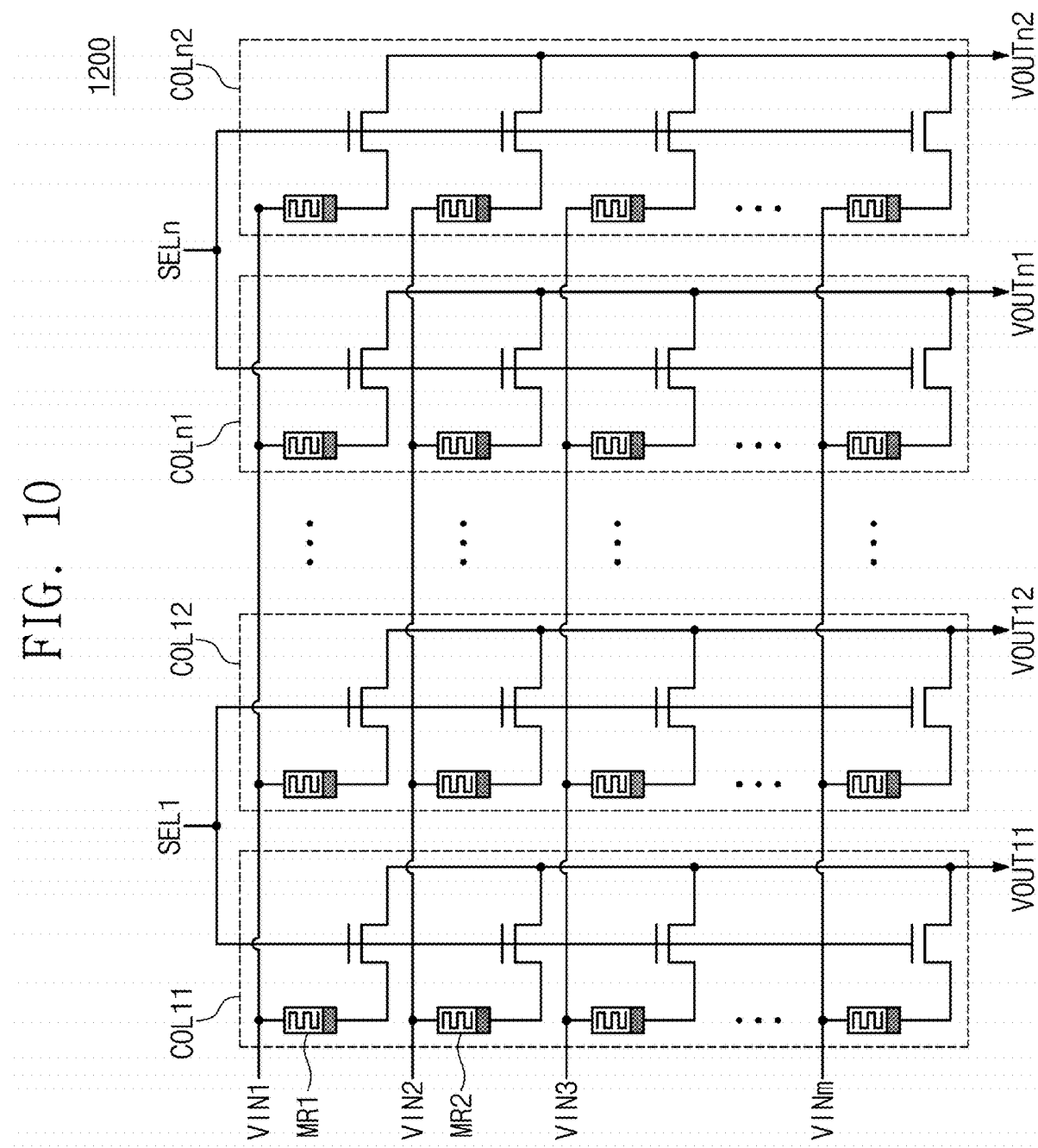
FIG. 10 is a circuit diagram illustrating an example configuration of a memristor array circuit of FIG. 1.

FIG. 10 is a circuit diagram illustrating an example configuration of a memristor array circuit of FIG. 1.

Referring to FIG. 10, the memristor array circuit 1200 may include a memory cell array including "m" rows ("m" being a natural number) and "2n" columns. The memristor array circuit 1200 may include columns COL11 and COL12 to COLn1 and COLn2. Each of the columns COL11 and COL12 to COLn1 and COLn2 may include "m" memory cells. Each of the memory cells may include a memristor component and a transistor. For example, memory cells may include memristor components MR1 and MR2, respectively.

The signal SEL received from the gate circuit 1600 may include the signals SEL1 to SELn respectively corresponding to the "2n" columns. The signals SEL1 to SELn may be respectively received by the "2n" columns. Each of the signals SEL1 to SELn may be received by two columns. For example, the signal SEL1 may be received by the columns COL11 and COL12, and the signal SELn may be received by the columns COLn1 and COLn2. Because the signals SEL1 to SELn are sequentially output from the gate circuit 1600, the signals SEL1 to SELn may be sequentially received. The voltage VIN received from the input circuit 1100 may include voltages VIN1 to VINm respectively corresponding to the "m" rows. The voltages VIN1 to VINm may be respectively received by the "m" rows.

Gate terminals of the transistors may be connected with lines of the signal SEL received from the gate circuit 1600. For example, the gate terminals of the transistors included in the columns COL11 and COL12 may be connected with a line of the signal SEL1, and the gate terminals of the transistors included in the columns COLn1 and COLn2 may be connected with a line of the signal SELn. Each of the memristor components may be connected between a line of the voltage VIN and the transistor. For example, the memristor components may be connected between the corresponding transistors and lines of the voltages VIN1 to VINm.

The voltage VOUT of FIG. 1 may include voltages VOUT11 and VOUT12 to VOUTn1 and VOUTn2 of FIG. 10. The voltage VOUT11 may correspond to a sum of currents flowing through the memristor resistors and the transistors included in the column COL11. For example, currents, the levels of which are determined by levels of the voltages VIN1 to VINm and resistance values of memristor resistors, may flow through transistors. The voltage VOUT11 may be output from the column COL11 by the currents flowing through the transistors.

Figure 11:
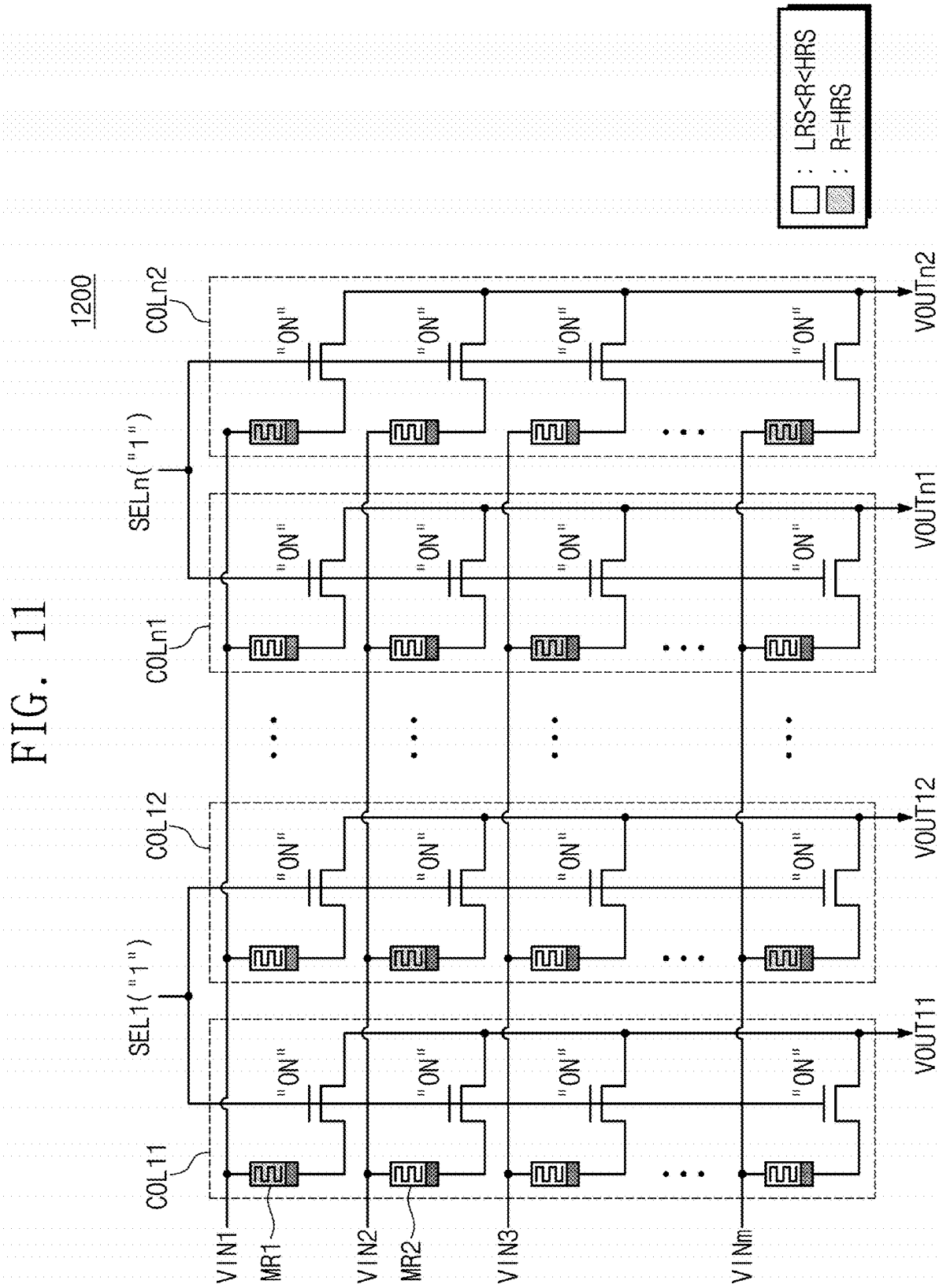
FIGS. 11 and 12 are circuit diagrams illustrating example operations of a memristor array circuit of FIG. 10.

FIG. 11 is a circuit diagram illustrating example operations of a memristor array circuit of FIG. 10.

As described in operation S110 of FIG. 2, the pre-training may be performed on the memristor array circuit 1200. As described with reference to FIG. 9, the signals SEL1 to SELn having a logical value of "1" may be received by the columns COL11 and COL12 to COLn1 and COLn2 for the pre-training. All the transistors included in the columns COL11 and COL12 to COLn1 and COLn2 may be turned on in response to the signals SEL1 to SELn having a logical value of "1".

Because the signals SEL1 to SELn are sequentially output from the gate circuit 1600, the memory cells of the columns COL11 and COL12 to COLn1 and COLn2 may be sequentially activated. In detail, the transistors included in the columns COL11 and COL12 to COLn1 and COLn2 may be sequentially turned on in the unit of column. For example, the transistors of the columns COL11 and COL12 may be turned on in response to the signal SEL1 received during a first time period. During a second time period after the first time period, the transistors of the columns COLn1 and COLn2 may be turned on in response to the signal SELn.

Accordingly, currents may flow through memristor components having particular resistance values from the lines of the voltages VIN1 to VINm. Levels of the currents may correspond to the levels of the voltages VIN1 to VINm, respectively. Resistance values of the memristor components may be changed by the currents flowing through the memristor components. Accordingly, the memristor components may have resistance values corresponding to the levels of the voltages VIN1 to VINm.

Because the levels of the voltages VIN1 to VINm correspond to input data generated by the processor 10, the memristor components may store input data as resistance values thereof. That is, the resistance values of the memristor components may be changed based on the input data. In the example of FIG. 11, the levels of the voltages VIN1 to VINm may indicate the input data for the pre-training. For example, the input data may be associated with weights of the memristor components.

As resistance values of the memristor components are changed by the voltages VIN1 to VINm (i.e., as the memristor array circuit 1200 is programmed by the voltages VIN1 to VINm), the memristor array circuit 1200 may store weights for the pre-training. For example, the memristor component MR1 may have a relatively great resistance value by the voltage VIN1. That is, the memristor component MR1 may be programmed to the HRS. For example, the memristor component MR2 may have any resistance value smaller than the resistance value corresponding to the HRS, by the voltage VIN2. That is, the memristor component MR2 may be programmed to a state between the HRS and the LRS.

A level of the voltage VOUT11 may correspond to a sum of levels of currents flowing through memristor resistors of the column COL11. The levels of the currents flowing through the memristor resistors may correspond to resistance values of the memristor resistors, respectively. Because the memristor resistors store weights programmed by the voltages VIN1 to VINm, the voltage VOUT11 may have a level according to weights stored by the memristor resistors.

That is, the voltage VOUT11 may indicate output data that are generated depending on the weights stored at the column COL11. As in the above description, columns of the memristor array circuit 1200 may output voltages VOUT11 and VOUT12 to VOUTn1 and VOUTn2 indicating pieces of output data generated depending on programmed weights.

Because the columns COL11 and COL12 to COLn1 and COLn2 operate in response to the sequentially received signals SEL1 to SELn, the voltages VOUT11 and VOUT12 to VOUTn1 and VOUTn2 may be sequentially output. For example, the voltages VOUT11 and VOUT12 may be output during a first time period, and the voltages VOUTn1 and VOUTn2 during a second time period after the first time period.

Afterwards, as described in operation S120 of FIG. 2, the processor 10 may obtain defect information from result data generated by the calculating circuit 1300 based on the voltages VOUT11 and VOUT12 to VOUTn1 and VOUTn2.

Figure 12:
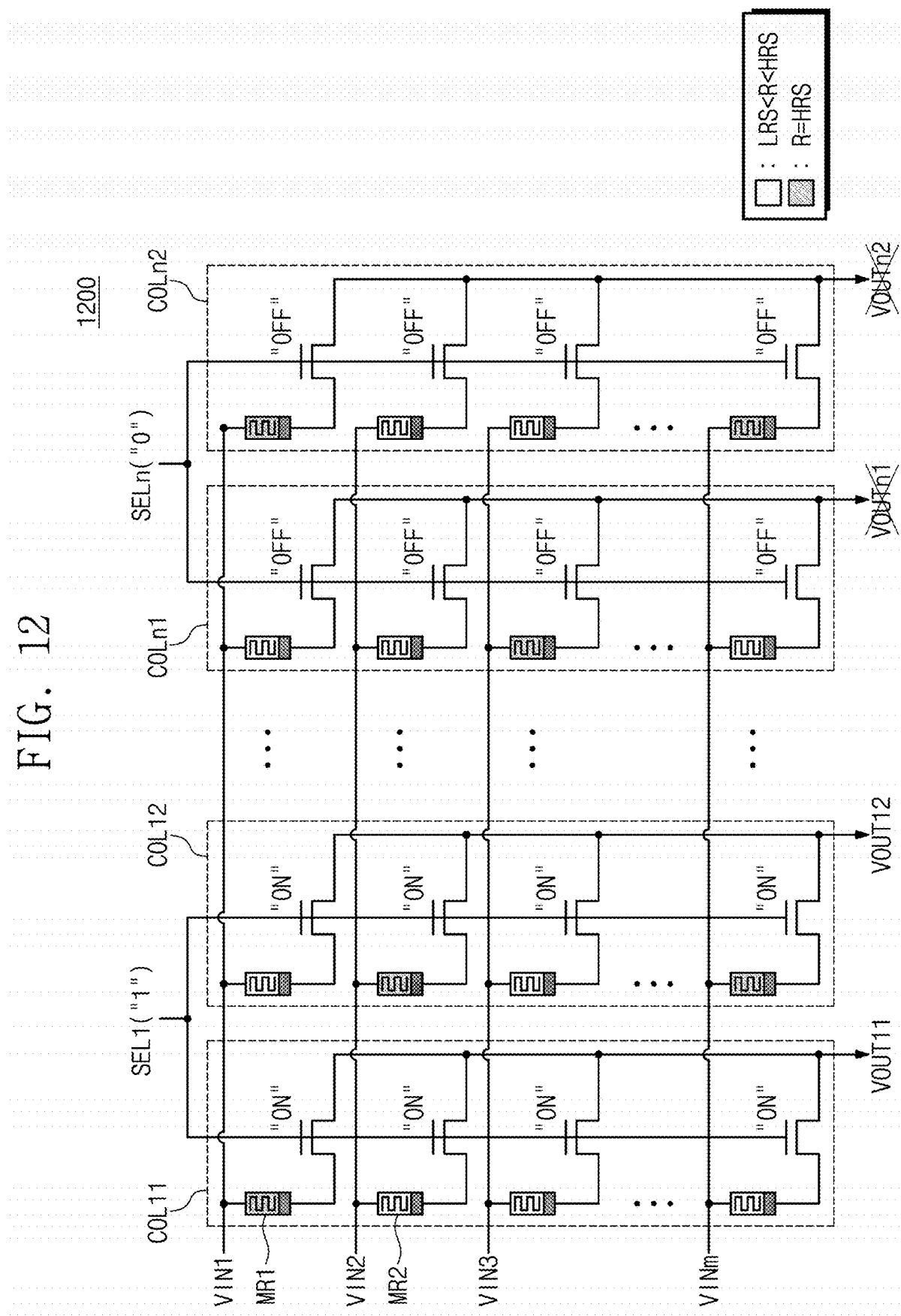

FIG. 12 is a circuit diagram illustrating example operations of a memristor array circuit of FIG. 10.

As described in operation S130 of FIG. 2, the re-training may be performed on the memristor array circuit 1200. For example, the columns COL11 and COL12 may be selected as target columns by the processor 10, and the columns COLn1 and COLn2 may not be selected as target columns by the processor 10.

As described with reference to FIGS. 7 and 8, for the re-training, the signal SEL1 having a logical value of "1" may be received by the columns COL11 and COL12, and the signal SELn having a logical value of "0" may be received by the columns COLn1 and COLn2. Transistors included in the columns COL11 and COL12 may be turned on in response to the signal SEL1 having a logical value of "1". Transistors included in the columns COLn1 and COLn2 may be turned off in response to the signal SEL1 having a logical value of "0".

Accordingly, currents may flow through memristor components of the columns COL11 and COL12 from lines of the voltages VIN1 to VINm. Levels of the currents flowing through the memristor components may correspond to the levels of the voltages VIN1 to VINm, respectively. Resistance values of the memristor components may be changed by the currents flowing through the memristor components. For example, a resistance value of the memristor component MR1 may decrease, and a resistance value of the memristor component MR2 may increase.

The memristor components of the columns COL11 and COL12 may store input data for the re-training as resistance values thereof. However, because currents are blocked by the transistors of the columns COLn1 and COLn2, the re-training for the memristor components of the columns COLn1 and COLn2 may be omitted. That is, the voltages VOUTn1 and VOUTn2 may not be output from the columns COLn1 and COLn2. In the example of FIG. 12, the levels of the voltages VIN1 to VINm may indicate the input data for the re-training. For example, the levels of the voltages VIN1 to VINm may be associated with weights of the memristor components.

As resistance values of the memristor components included in the columns COL11 and COL12 are changed by the voltages VIN1 to VINm (i.e., as the memristor array circuit 1200 is programmed by the voltages VIN1 to VINm), the memristor array circuit 1200 may store weights through the re-training.

For example, the memristor component MR1 may have a relatively great weight (or a relatively great resistance value) by the voltage VIN1. That is, the memristor component MR1 may be programmed to the HRS. For example, the memristor component MR2 may have a relatively small weight (or any resistance value smaller than a resistance value corresponding to the HRS) by the voltage VIN2. That is, the memristor component MR2 may be programmed to a state between the HRS and the LRS.

Because the re-training is performed depending on whether a memory cell includes a defect, costs (e.g., a time or energy) necessary for the re-training may increase. However, according to an embodiment of the inventive concept, as described with reference to FIG. 12, because the re-training is performed only on target columns (e.g., the columns COL11 and COL12) selected by the processor 10 and the re-training is not performed on columns not being the target columns, a time taken to perform the re-training may decrease. Also, energy (e.g., a power) necessary to perform the re-training may decrease.

Figure 13:
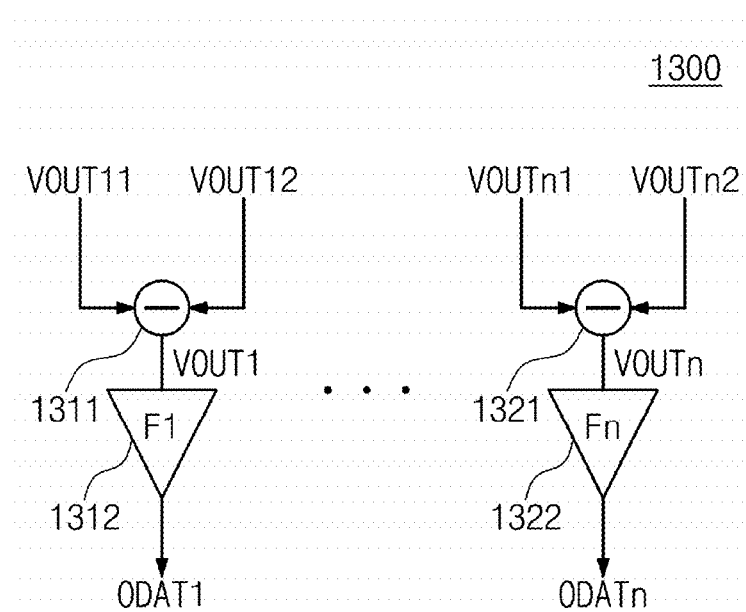
FIG. 13 is a circuit diagram illustrating an example configuration of a calculating circuit of FIG. 1.

FIG. 13 is a circuit diagram illustrating an example configuration of a calculating circuit of FIG. 1.

The calculating circuit 1300 may include adders 1311 to 1321 and function circuits 1312 to 1322. The number of the adders 1311 to 1321 and the number of the function circuits 1312 to 1322 may correspond to the number of columns included in the memristor array circuit 1200. For example, in the case where the memristor array circuit 1200 includes "2n" columns, the calculating circuit 1300 may include "n" adders 1311 to 1321 and "n" function circuits 1312 to 1322.

The adders 1311 to 1321 may receive the voltages VOUT11 and VOUT12 to VOUTn1 to VOUTn2 from the memristor array circuit 1200. For example, the adder 1311 may receive the voltages VOUT11 and VOUT12, and the adder 1321 may receive the voltages VOUTn1 and VOUTn2.

The adders 1311 to 1321 may respectively output the voltages VOUT1 to VOUTn based on the voltages VOUT11 and VOUT12 to VOUTn1 to VOUTn2. For example, the adder 1311 may output a voltage VOUT1 based on the voltages VOUT11 and VOUT12, and the adder 1321 may output a voltage VOUTn based on the voltages VOUTn1 and VOUTn2. Because the voltages VOUT11 and VOUT12 to VOUTn1 to VOUTn2 indicate pieces of output data generated by the columns COL11 and COL12 to COLn1 and COLn2, respectively, the voltages VOUT1 to VOUTn may indicate the pieces of output data generated by the columns COL11 and COL12 to COLn1 and COLn2, respectively.

For example, the adders 1311 to 1321 may calculate differences between levels of received voltages. A level of the voltage VOUT1 output from the adder 1311 may correspond to a difference between a level of the voltage VOUT11 and a level of the voltage VOUT12. A level of the voltage VOUTn output from the adder 1321 may correspond to a difference between a level of the voltage VOUTn1 and a level of the voltage VOUTn2.

The function circuits 1312 to 1322 may include electronic circuits for implementing an activation function according to various algorithms. The function circuits 1312 to 1322 may perform a calculation according to an activation function based on output data of the voltages VOUT1 to VOUTn. Accordingly, a signal ODAT1 may indicate result data calculated from output data of the voltage VOUT1 (i.e., output data generated by the columns COL11 and COL12). A signal ODATn may indicate result data calculated from output data of the voltage VOUTn (i.e., output data generated by the columns COLn1 and COLn2).

The "n" signals ODAT1 to ODATn may be output to the processor 10 as the signal ODAT of FIG. 1. The processor 10 may perform various operations based on result data indicated by the signals ODAT1 to ODATn. For example, the processor 10 may obtain defect information based on the result data.

Figure 14:
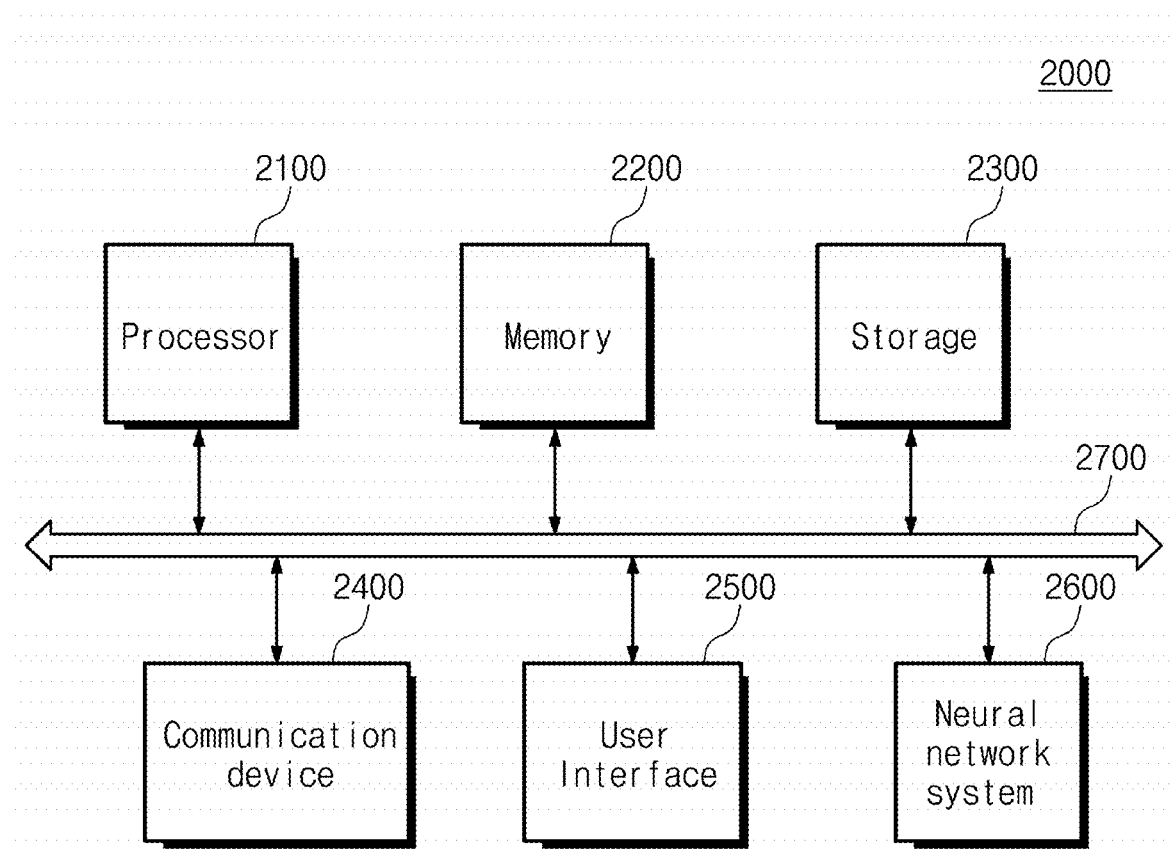
FIG. 14 is a block diagram illustrating an example electronic device according to an embodiment of the inventive concept.

FIG. 14 is a block diagram illustrating an example electronic device including a neural network system according to an embodiment of the inventive concept.

For example, an electronic device 2000 may be one of a personal computer, a workstation, a notebook computer, a mobile device, etc. Referring to FIG. 14, the electronic device 2000 may include a processor 2100, a memory 2200, storage 2300, a communication device 2400, a user interface 2500, a neural network system 2600, and a bus 2700. The electronic device 2000 may further include other components (e.g., various sensors and a power supply) that are not illustrated in FIG. 14. Alternatively, the electronic device 2000 may not include one or more of the components illustrated in FIG. 14.

The processor 2100 may control overall operations of the electronic device 2000. The processor 2100 that is a central control device may process operations necessary for an operation of the electronic device 2000. For example, the processor 2100 may process data for controlling operations of the electronic device 2000. For example, the processor 2100 may be one of a general-purpose processor, a workstation processor, an application processor, etc. The processor 2100 may include one processor core (i.e., a single core) or may include a plurality of processor cores (i.e., a multi-core). For example, the processor 2100 may include a multi-core such as a dual-core, a quad-core, a hexa-core, or the like.

The processor 2100 may include the processor 10 of FIG. 1. The processor 10 may generate input data for the pre-training and the re-training of the neural network system 2600. Alternatively, the processor 2100 may generate input data corresponding to a question input by the user. The processor 2100 may obtain defect information based on result data provided from the neural network system 2600.

The memory 2200 may store data processed or to be processed by the processor 2100. For example, the memory 2200 may include a volatile memory such as a static random access memory (SRAM), a dynamic RAM (DRAM), a synchronous DRAM (SDRAM), etc. or a nonvolatile memory such as a flash memory, a phase-change RAM (PRAM), a magneto-resistive RAM (MRAM), a resistive RAM (ReRAM), a ferroelectric RAM (FRAM), etc. Alternatively, the memory 2200 may include heterogeneous memories.

The storage 2300 may store data regardless of whether a power is supplied. For example, the storage 2300 may be a storage medium, which includes a nonvolatile memory, such as a hard disk drive (HDD), a solid state drive (SSD), a secure digital (SD) card, a universal serial bus (USB) memory device, or the like.

The communication device 2400 may include a transmission unit and a reception unit. The electronic device 2000 may communicate with another electronic device through the communication device 2400 to transmit and/or receive data. The user interface 2500 may provide an input/output of an instruction or data between the user and the electronic device 2000. For example, the user interface 2500 may include a physical device such as an input device and/or an output device. The input device may include a keyboard, a mouse, a touchscreen, a scanner, a joystick, a voice recognition device, a motion recognition device, or an eyeball recognition device, and the output device may include a monitor, a display device, a projector, a speaker, or a plotter.

For example, the user may input an instruction through the user interface 2500 for the purpose of obtaining an answer to a question. The user interface 2500 may provide the user with information about the answer corresponding to the question.

The neural network system 2600 may include the neural network system 1000 of FIG. 1. As described with reference to FIGS. 1 to 13, the neural network system 2600 may operate the signals CS and IDAT received from the processor 2100. For example, the neural network system 2600 may be pre-trained and re-trained based on the signals CS and IDAT, and result data that indicate the answer to the question input by the user may be output by the trained neural network system 2600.

The bus 2700 may provide a communication path between the components of the electronic device 2000. For example, the processor 2100, the memory 2200, the storage 2300, the communication device 2400, the user interface 2500, and the neural network system 2600 may exchange data with each other through the bus 2700. The bus 2700 may be configured to support various communication formats used in the electronic device 2000.

According to an embodiment of the inventive concept, a time and a power necessary to train a neural network may decrease.

While the inventive concept has been described with reference to example embodiments thereof, it will be apparent to those of ordinary skill in the art that various changes and modifications may be made thereto without departing from the spirit and scope of the inventive concept as set forth in the following claims.

What is claimed is:

1. A neural network system comprising:
   an array circuit configured to generate output data, based on first input data, by a plurality of memory cells;
   an input circuit configured to output the first input data and second input data to the array circuit; and
   a gate circuit configured to output a select signal to the array circuit, based on defect information obtained based on the output data, wherein a target memory cell, from among the plurality of memory cells, is trained based on the second input data, the target memory cell being activated in response to the select signal, and wherein the defect information is associated with a defect included in the plurality of memory cells.

2. The neural network system of claim 1, further comprising:

a calculating circuit configured to perform a calculation according to an activation function based on the output data, to output result data.

3. The neural network system of claim 2, wherein the defect information is obtained further based on the result data.

4. The neural network system of claim 1, wherein each of the plurality of memory cells includes a memristor component.

5. The neural network system of claim 1, wherein the target memory cell includes a memristor component, and wherein a characteristic value of the memristor component varies as the target memory cell is trained based on the second input data.

6. The neural network system of claim 1, wherein the plurality of memory cells are formed with a crossbar structure.

7. The neural network system of claim 1, wherein the plurality of memory cells are programmed by the first input data during a first time period, and wherein the target memory cell, among the plurality of programmed memory cells, is reprogrammed by the second input data during a second time period, the second time period being after the first time period.

8. The neural network system of claim 1, wherein the gate circuit is further configured to output the select signal to activate memory cells of a target column, the memory cells of the target column including the target memory cell.

9. The neural network system of claim 1, wherein the gate circuit is further configured to store target data associated with whether to activate the target memory cell.

10. The neural network system of claim 9, wherein the gate circuit includes a memristor component configured to store the target data.

11. A neural network system comprising:

a gate circuit configured to, based on defect information,
output a select signal having a first logical value to activate a target column, or
output the select signal having a second logical value to deactivate the target column;

an array circuit configured to generate output data, corresponding to input data, by the target column, the target column being programmed by the input data in response to being activated by the select signal of the first logical value and not being programmed by the input data in response to being deactivated by the select signal of the second logical value; and an input circuit configured to output the input data to the array circuit, wherein the defect information is associated with an error included in the output data.

12. The neural network system of claim 11, wherein the error is associated with a defect included in the target column.

13. The neural network system of claim 11, further comprising:

a calculating circuit configured to perform a calculation according to an activation function based on the output data, to output result data.

14. The neural network system of claim 13, wherein the error is calculated based on the result data.

15. A neural network system comprising:

a gate circuit configured to
output a select signal to a first column during a first time period based on defect information, and
output the select signal to a second column during a second time period based on the defect information, the second time period being after the first time period; and an array circuit including the first column and the second column, wherein the first column and the second column are configured to generate an output voltage in response to the select signal of a first logical value, and deactivated in response to the select signal of a second logical value, and wherein the defect information is associated with output data.

16. The neural network system of claim 15, wherein the defect information is obtained from data calculated based on a level of the output voltage and an error function.

17. The neural network system of claim 15, wherein memory cells in the first column are configured to output a first voltage based on an input voltage during the first time period, and wherein memory cells in the second column are configured to output a second voltage based on the input voltage during the second time period.

18. The neural network system of claim 17, further comprising:

a calculating circuit configured to output result data based on a level of the first voltage and a level of the second voltage.

19. The neural network system of claim 18, wherein the defect information is further associated with an error calculated based on the result data.

20. The neural network system of claim 15, wherein the defect information includes information about whether to activate memory cells of the first column and memory cells of the second column.

* * * * *